United States Patent
Huebner et al.

(10) Patent No.: US 10,881,038 B2
(45) Date of Patent: Dec. 29, 2020

(54) CONTROL SYSTEM

(71) Applicant: Mahle International GmbH, Stuttgart (DE)

(72) Inventors: Steffen Huebner, Leonberg (DE); David Moczko, Stuttgart (DE); Florian Wetzel, Baltmannsweiler (DE)

(73) Assignee: Mahle International GmbH

( * ) Notice: Subject to any disclaimer, the term of this patent is extended or adjusted under 35 U.S.C. 154(b) by 0 days.

(21) Appl. No.: 16/186,537

(22) Filed: Nov. 10, 2018

(65) Prior Publication Data

US 2019/0150330 A1     May 16, 2019

(30) Foreign Application Priority Data

Nov. 10, 2017   (DE) .................. 10 2017 220 105

(51) Int. Cl.
| | |
|---|---|
| H05K 5/00 | (2006.01) |
| H05K 9/00 | (2006.01) |
| F02B 37/18 | (2006.01) |
| B60H 1/00 | (2006.01) |
| F02M 26/00 | (2016.01) |
| F01N 13/00 | (2010.01) |
| F02D 9/04 | (2006.01) |

(52) U.S. Cl.
CPC ............. *H05K 9/0067* (2013.01); *B60H 1/00* (2013.01); *F01N 13/00* (2013.01); *F02B 37/186* (2013.01); *F02D 9/04* (2013.01); *F02M 26/00* (2016.02); *H05K 9/0045* (2013.01); *H05K 9/0047* (2013.01); *H05K 5/00* (2013.01)

(58) Field of Classification Search
None
See application file for complete search history.

(56) References Cited

U.S. PATENT DOCUMENTS

| | | | |
|---|---|---|---|
| 4,783,279 A | 11/1988 | Petermann et al. | |
| 5,714,102 A | 2/1998 | Highum et al. | |
| 6,136,429 A * | 10/2000 | Saito .................... | H05K 9/0015 428/212 |
| 8,456,851 B2 * | 6/2013 | Grunthaner ............ | H05K 1/147 361/749 |
| 9,130,288 B2 * | 9/2015 | Holland ................. | H01R 43/26 |

(Continued)

FOREIGN PATENT DOCUMENTS

| | | |
|---|---|---|
| DE | 36 26 460 A1 | 2/1988 |
| DE | 199 35 428 C1 | 7/2000 |

(Continued)

OTHER PUBLICATIONS

English abstract for DE-199 35 428.

*Primary Examiner* — Courtney L Smith
*Assistant Examiner* — Rashen E Morrison
(74) *Attorney, Agent, or Firm* — Fishman Stewart PLLC

(57) ABSTRACT

A control system for a motor vehicle, in particular for an electric or hybrid vehicle, wherein the control system has at least one actuator and at least one sensor. The control system further has a protective housing comprising an interior, wherein the at least one actuator and the at least one sensor are arranged within the interior. The protective housing has an injection molded body constructed of a plastic material and comprising an interference field protective zone configured to at least partially shield electromagnetic interference fields.

20 Claims, 1 Drawing Sheet

(56) References Cited

U.S. PATENT DOCUMENTS

| | | | |
|---|---|---|---|
| 9,706,692 B2* | 7/2017 | Sumi | H01B 7/0216 |
| 10,149,416 B2* | 12/2018 | Polak | H02J 7/025 |
| 2007/0096278 A1* | 5/2007 | Nakatsu | H01L 23/3675 |
| | | | 257/678 |
| 2008/0070003 A1* | 3/2008 | Nakatani | G06K 19/07771 |
| | | | 428/141 |
| 2009/0107694 A1* | 4/2009 | Watanabe | H01B 7/16 |
| | | | 174/102 R |
| 2011/0025850 A1* | 2/2011 | Maekawa | H05K 9/002 |
| | | | 348/148 |
| 2012/0153752 A1* | 6/2012 | Haas | H01H 50/10 |
| | | | 310/72 |
| 2012/0300522 A1* | 11/2012 | Tokuyama | H01L 24/34 |
| | | | 363/131 |
| 2016/0179229 A1* | 6/2016 | Ahn | H01L 27/323 |
| | | | 345/173 |
| 2017/0064851 A1* | 3/2017 | Shin | F16M 11/22 |
| 2019/0189321 A1* | 6/2019 | Bardi | F02M 51/005 |

FOREIGN PATENT DOCUMENTS

| | | |
|---|---|---|
| DE | 698 14 500 T2 | 4/2004 |
| EP | 2 486 357 A2 | 8/2012 |
| GB | 2 269 703 A | 2/1994 |
| WO | 2003/043 399 A1 | 5/2003 |
| WO | 2013/092 165 A1 | 6/2013 |

* cited by examiner

CONTROL SYSTEM

CROSS-REFERENCE TO RELATED APPLICATION

This application claims priority to German Patent Application No. DE 10 2017 220 105.3, filed on Nov. 10, 2017, the contents of which are hereby incorporated by reference in their entirety.

TECHNICAL FIELD

The invention relates to a control system for a motor vehicle, in particular for an electric or hybrid vehicle, according to the preamble of claim 1.

BACKGROUND

A control system has actuators and/or sensors, which are arranged in a housing and are protected against external influences in this way. The actuators and the sensors thereby use electromagnetic fields to capture data and/or to control a further mechanical system. However, the function of such a control system can be limited or disrupted by external electromagnetic interference fields. The electromagnetic interference fields cannot be shielded by the housing, which is usually made of a plastic.

In particular in an electric or hybrid vehicle, strong electromagnetic interference fields can be created by means of a high-voltage network of a traction battery. To prevent a malfunction of the control system in the electric or hybrid vehicle, special protective measures have to be taken. The housing of the control system can for example be made of a ferritic steel and the electromagnetic interference fields can be shielded. Disadvantageously, the production of such a housing is expensive and complex. In the alternative, stronger actuators and/or stronger magnets and/or more sensitive sensors can also be used in the control system, which is also associated with high costs. A retroactive adaptation of the housing and of the control system to changed protection requirements is further only associated with an enormous effort in particular due to a tight installation space.

SUMMARY

It is thus the object of the invention to specify an improved or at least alternative embodiment for a control system of the generic type, in the case of which the described disadvantages are overcome.

According to the invention, this object is solved by the subject matter of the independent claims claim 1. Advantageous embodiments are the subject matter of the dependent claims.

A control system for a motor vehicle, in particular for an electric or hybrid vehicle, thereby has at least one actuator and/or at least one sensor. The control system further comprises a protective housing comprising an interior, in which the at least one actuator and/or the at least one sensor are arranged. Electromagnetic interference fields can thereby be at least partially shielded by means of the protective housing. According to the invention, the protective housing has an injection molded body of a plastic material comprising an interference field protective zone for shielding the electromagnetic interference fields.

The injection molded body can be produced cost-efficiently, for example by an injection molding process, and can have a shape, which depends on the respective control system. Depending on the control system, in particular a locking device and/or a holder can also be produced, without the production costs of the protective housing and thus of the control system increasing significantly. The interference field protective zone is thereby encompassed by the injection molded body and shields the electromagnetic interference fields at least partially. Electromagnetic field lines of the electromagnetic interference fields thereby run around the interior of the protective housing, so that the at least one actuator and/or the at least one sensor are not or only slightly influenced in the protective housing. The protective housing can thereby be a separate housing, an actuator housing or a control device housing. The interference field protective zone can thereby extend across the injection molded body in some areas and can shield only the actuator and/or the sensor from the electromagnetic interference fields. In the alternative, the interference field protective zone can also extend across the entire injection molded body. It can advantageously be provided that the interference field protective zone is arranged around the interior of the protective housing and completely surrounds the interior radially. The at least one actuator and/or the at least one sensor are shielded from the electromagnetic interference fields in this way and the functions of the control system are maintained. An EMV circuit (EMV: electromagnetic compatibility) and/or a circuit for evaluation and/or for temperature compensation and/or for conversion of a sensor signal, in particular an analog-digital converter circuit, and/or a permanent magnet as signal generator for the at least one sensor can advantageously be arranged in the interior of the protective housing and can be completely surrounded radially by the interference field protective zone. In the alternative or in addition, a component, in particular a shaft, can be supported in the interior of the protective housing at least in some areas in a linearly movable or rotating manner. A signal generator for the at least one sensor, in particular a permanent magnet, can then be fastened to the component.

The control system can thereby be an exhaust gas damper control, a suction pipe control, a valve control of a charge air regulating system, a transfer case control, an exhaust gas recirculation control, a thermostatic valve control, a wastegate control of an exhaust gas turbocharger, or an actuator control of a variable turbine geometry supercharger, or an electric motor control. The control system can be an electromagnetic control system.

In the case of an advantageous further development of the control system according to the invention, it is provided that the interference field protective zone in the injection molded body is formed by means of an interference field protective part. The interference field protective part can thus for example have a shape, which follows the interior, and can consist of a material, which shields the electromagnetic interference fields, or can include said material. The shielding material can thereby be ferromagnetic and/or paramagnetic and/or diamagnetic and can differ from the plastic material of the injection molded body. The material of the interference field protective part can advantageously have a higher thermal conductivity value than the plastic material of the injection molded body. The interference field protective part can thereby be a sintered component, a punch component or a bending part. The interference field protective part can thus for example be made of a steel sheet in a punching process. The interference field protective part can further encase the interior of the protective housing in some areas or completely, so that the electromagnetic interference fields are also shielded in some areas or completely. The interference field protective part can be fixed to the injection molded body in a form fit, in a force fit or in an integrally bonded manner or can in the alternative be embedded into the plastic material at least in some areas. The interference field protective part can thus for example be completely embedded into the plastic material of the injection molded body or can be surrounded by the plastic material on the inner side or on the outer side.

In the case of a further development of the control system according to the invention, it is advantageously provided that a plurality of material pieces is added to the plastic material of the injection molded body and the interference field protective zone is thus formed. The plurality of material pieces can thereby have a size of a few micrometers to a few millimeters, so that a production of the injection molded body is not or only slightly influenced by the added material pieces. The injection molded body can be produced in a particularly effort-reduced and cost-efficient manner in this way. Depending on the added amount of the material pieces, the shielding effect of the protective housing can further be varied, depending on the control system and the application, so that the structural production expenditure is reduced significantly. The shielding effect of the protective housing can further be improved subsequently with a reduced structural production expenditure even in the case of an already existing control system, depending on the customer-specific application or in response to a rising protection requirement. The material pieces can thereby consist of a ferromagnetic and/or paramagnetic and/or diamagnetic material. The material of the material pieces can advantageously have a higher thermal conductivity value than the plastic material of the injection molded body. The material pieces can further be flake-, chip-, ball-, powder-, dust-shaped or cylindrical.

To also be able to shield electrical interference fields, the plastic material of the injection molded body can be electroconductive and the injection molded body can be earthed. A so-called Faraday cage, which advantageously shields electrical interference fields, can thus be formed in the interior of the protective housing. Electrical interference fields can also be shielded in the same way by means of the electroconductive and earthed interference protective part in the injection molded body.

Advantageously, it can further be provided that the injection molded body is connected to a heat sink so as to transfer heat. The injection molded body thereby forms a heat source, so that the heat generated in the injection molded body is emitted to the heat sink and the injection molded body is cooled. The heat sink can advantageously be connected to the interference field protective part so as to transfer heat, and the interference field protective part can be thermally insulated to the outside by means of a plastic insulation—for example from an external heat source. The heat sink can thereby discharge the heat generated in the interference field protective part via a coolant flow. The plastic insulation thereby prevents a heating of the interference field protective part and of the control system, which is shielded from the interference field protective part, by means of surrounding components, such as for example an electric motor.

In addition, the protective housing can furthermore have at least one additional housing part, which is fixed to the injection molded body in an integrally bonded manner, preferably by means of an ultrasonic welding. Complex geometries of the protective housing can advantageously also be realized in a cost-efficient and effort-reduced manner in this way.

The electromagnetic interference fields are shielded by the protective housing in the control system according to the invention, and the at least one actuator and/or the at least one sensor are protected efficiently. The protective housing can further be produced in a cost-efficient and effort-reduced manner, whereby the production costs for the entire control system are reduced. Complex geometries of the protective housing can advantageously also be realized in a cost-efficient manner.

Further important features and advantages of the invention follow from the subclaims, from the drawings, and from the corresponding figure description by means of the drawings.

It goes without saying that the above-mentioned features and the features, which will be described below, cannot only be used in the respective specified combination, but also in other combinations or alone, without leaving the scope of the present invention.

Preferred exemplary embodiments of the invention are illustrated in the drawings and will be described in more detail in the following description, whereby identical reference numerals refer to identical or similar or functionally identical components.

BRIEF DESCRIPTION OF THE DRAWINGS

In each case schematically.

DETAILED DESCRIPTION

Figure 1:
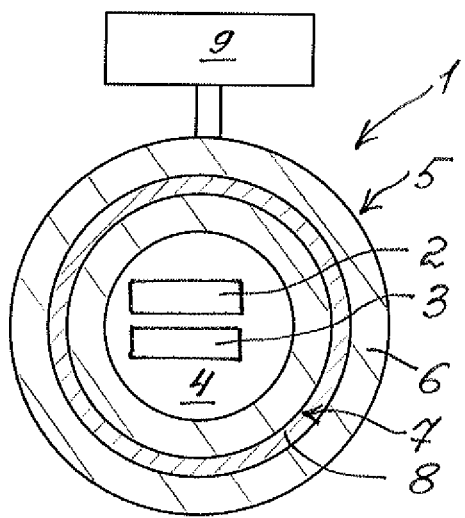
FIG. 1 shows a sectional view of a control system according to the invention, which is connected to a heat sink so as to transfer heat.

FIG. 1 shows a schematic sectional view of a control system 1 according to the invention. The control system 1 is suitable for a motor vehicle, in particular for an electric or hybrid vehicle, and can for example be an exhaust gas damper control, a suction pipe control, a valve control of a charge air regulating system, a transfer case control, an exhaust gas recirculation control, a thermostatic valve control, or an electric motor control. In this exemplary embodiment, the control system 1 has an actuator 2 and a sensor 3, which use electromagnetic fields to capture data and to control a further mechanical system. The actuator 2 and the sensor 3 are thereby arranged in an interior 4 of a protective housing 5. The protective housing 5 thereby comprises an injection molded body 6 of a plastic material comprising an interference field protective zone 7 for shielding electromagnetic interference fields.

In this exemplary embodiment, the interference field protective zone 7 in the injection molded body 6 is formed by means of an interference field protective part 8. The interference field protective part 8 consists of a ferromagnetic and/or paramagnetic and/or diamagnetic material and is completely embedded into the injection molded body 6. The ferromagnetic and/or paramagnetic material acts as a magnetic bypass, so that the magnetic field line density in the interference field protective part 8 rises. The diamagnetic material deflects the magnetic field lines, so that the magnetic field line density in the interference field protective part 8 is lowered. The ferromagnetic and/or paramagnetic material can advantageously be combined with the diamagnetic material, in order to attain a required shielding effect. In the alternative, the interreference field protective part 8 can also be embedded into the injection molded part 6 in some areas or can be fixed to the injection molded body 6 in a form fit, in a force fit or in an integrally bonded manner. The interference field protective part 8 further has a shape, which follows the interior 4, and completely encases the actuator 2 and the sensor 3 in the interior 4. Electromagnetic interference fields are shielded by the interference field protective part 8 in this way, and the actuator 2 as well as the sensor 3 are protected. The malfunction of the control system 1 can thus in particular be prevented.

The protective housing 5 is further connected to a heat sink 9 so as to transfer heat, so that the heat generated in the injection molded body 6 of the protective housing 5 is emitted to the heat sink 9 and the injection molded body 6 is cooled.

Figure 2:
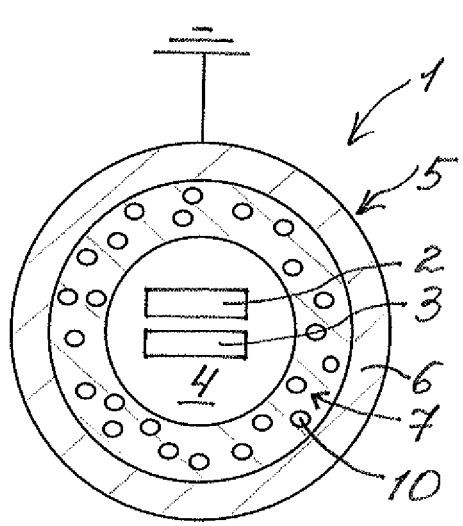
FIG. 2 shows a sectional view of an alternatively embodied and earthed control system.

FIG. 2 shows a schematic sectional view of the alternatively embodied control system 1. In this exemplary embodiment, a plurality of material pieces 10 is added to the plastic material of the injection molded body 6 and the interference field protective zone 7 is thus formed. The interference field protective zone 7 thereby extends in the injection molded body 6 only in some areas and completely encases the actuator 2 and the sensor 3 in the interior 4. In this exemplary embodiment, the material pieces 10 are embodied so as to be round and consist of a ferromagnetic and/or paramagnetic and/or diamagnetic material. The plurality of material pieces 10 is thereby dimensioned in such a way that the injection molded body 6 can be produced by an injection molding process in a known manner. Depending on the added amount of the material pieces 10, the shielding effect of the protective housing 5 can further be varied in an advantageous manner, depending on the control system 1 and the application.

In this exemplary embodiment, the plastic material of the injection molded body 6 is additionally electroconductive and the injection molded body 6 can be earthed. A so-called Faraday cage, which also shields electrical interference fields, is thus formed in the interior 4.

Figure 3:
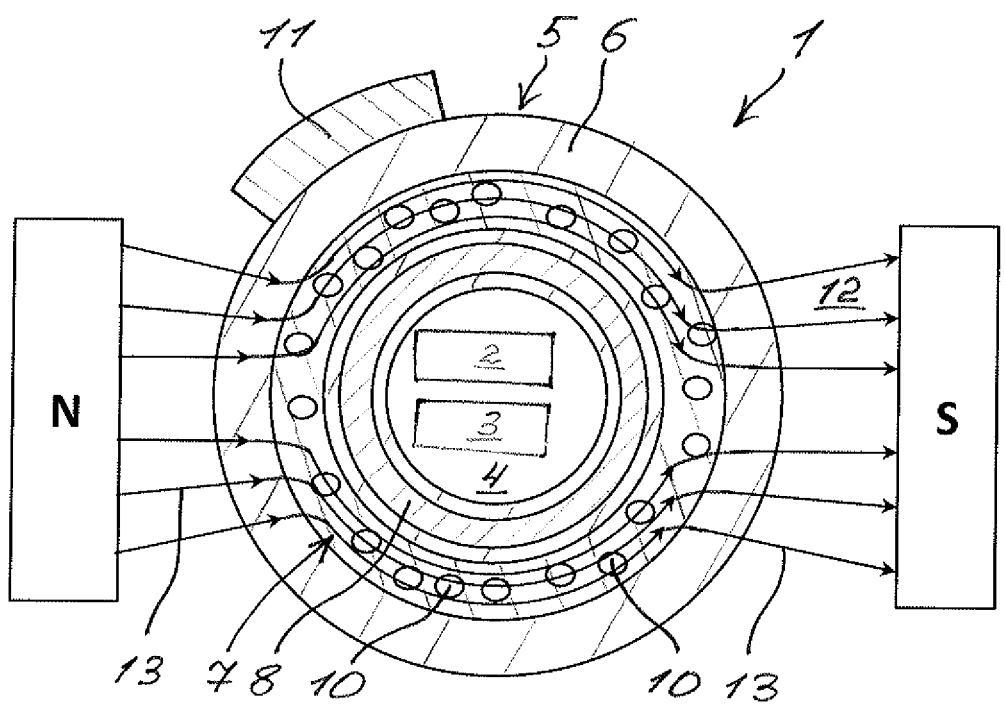
FIG. 3 shows a sectional view of a further alternatively embodied control system in an electromagnetic interference field.

FIG. 3 shows a sectional view of the control system 1 in a further alternative embodiment. The interference field protective zone 7 is formed here by the interference field protective part 8 and the material pieces 10 in the injection molded part 6. The protective housing 5 additionally has an additional housing part 11, which is fixed to the injection molded body 6, for example by means of an ultrasonic welding. The control system 1 is located here in an electromagnetic interference field 12, which is shielded by the interference field protective zone 7 in the injection molded body 6. Electromagnetic field lines 13 of the electromagnetic interference field 12 thereby run across the interference field protective zone 7 and around the interior 4 of the protective housing 5, so that the actuator 2 and the sensor 3 are not or only slightly influenced by the interference field 12 in the protective housing 5. Advantageously, a malfunction of the control system 1 can thus be prevented.

The electromagnetic interference fields 12 are advantageously shielded by the protective housing 5 in the control system 1 according to the invention, and a malfunction of the control system 1 is prevented. The protective housing 5 can further be produced in a cost-efficient and effort-reduced manner.

The invention claimed is:

1. A control system for a motor vehicle, in particular for an electric or hybrid vehicle, wherein the control system comprises:
    at least one of an actuator and a sensor, and
    a protective housing comprising an interior, wherein the at least one of the actuator and the sensor is arranged within the interior,
    wherein the protective housing has an injection molded body that includes a plastic material and an interference field protective zone with an interference field protective part that is configured to at least partially shield electromagnetic interference fields, and at least one of the injection molded body and the interference field protective part is electroconductive and earthed, and
    wherein the interference field protective part is at least one of:
        completely embedded into the plastic material of the injection molded body, and
        surrounded by the plastic material on one of an inner side of the interference field protective part and an outer side of the interference field protective part.

2. The control system according to claim 1, wherein the interference field protective zone is arranged around the interior of the protective housing and completely surrounds the interior radially.

3. A control system for a motor vehicle, wherein the control system comprises:
    at least one of an actuator and a sensor;
    a protective housing comprising an interior, wherein the at least one of the actuator and the sensor is arranged within the interior, wherein the protective housing has an injection molded body constructed of a plastic material and comprising an interference field protective zone configured to at least partially shield electromagnetic interference fields;
    at least one of:
    at least one of an EMV circuit and a circuit for at least one of evaluation and for temperature compensation and for conversion of a sensor signal, and a permanent magnet as signal generator for the at least one sensor is arranged in the interior of the protective housing and is completely surrounded radially by the interference field protective zone, and
    a shaft supported in the interior of the protective housing in one of a linearly movable manner and a rotating manner; and
    a signal generator fastened to the component for the at least one sensor.

4. The control system according to claim 1, wherein the interference field protective zone is formed in the injection molded body via an interference field protective part embedded into the plastic material.

5. The control system according to claim 3, wherein at least one of:
    the interference field protective part is completely embedded into the plastic material of the injection molded body; and
    the interference field protective part is surrounded by the plastic material on one of an inner side of the interference field protective part and an outer side of the interference field protective part.

6. The control system according to claim 4, wherein the interference field protective part comprises an interference field protective part material comprising at least one of a ferromagnetic material, a paramagnetic material, and a diamagnetic material.

7. The control system according to claim 1, further comprising a plurality of material pieces added into the interference field protective zone.

8. The control system according to claim 7, wherein the material pieces comprise at least one of a ferromagnetic material, a paramagnetic material, and a diamagnetic material.

9. The control system according to claim 7, wherein the material pieces are one of flake-shaped, chip-shaped, ball-shaped, powder-shaped, dust-shaped, and cylindrical.

10. The control system according to claim 6, wherein the interference field protective part material has a higher thermal conductivity value than the plastic material of the injection molded body.

11. The control system according to claim 3, wherein at least one of:
the plastic material of the injection molded body is electroconductive and the injection molded body is earthed, and
the interference field protective part is electroconductive and is earthed.

12. The control system according to claim 1, further comprising a heat sink coupled to the injection molded body and configured to receive heat generated by the injection molded body.

13. The control system according to claim 12, further comprising a plastic insulation configured to thermally insulate the interference field protective part from heat generated by a heat source external to the control system, and
wherein the heat sink is further coupled to the interference field protective part and configured to receive heat generated by the interference field protective part.

14. The control system according to claim 1, further comprising at least one additional housing part fixed to the injection molded body via ultrasonic welding.

15. The control system according to claim 1, wherein the control system comprises one of an exhaust gas damper control, a suction pipe control, a valve control of a charge air regulating system, a transfer case control, an exhaust gas recirculation control, a thermostatic valve control, a wastegate control of an exhaust gas turbocharger, an actuator control of a variable turbine geometry supercharger, and an electric motor control.

16. The control system according to claim 1, wherein the protective housing is one of a housing, an actuator housing, and a control device housing.

17. A control system comprising:
an injection molded body constructed of a plastic material and comprising an interference field protective zone formed therein, wherein the interference field protective zone includes an interference field protective part that is configured to at least partially shield an interior of the injection molded body from electromagnetic interference fields;
an actuator positioned within the interior; and
a sensor positioned within the interior,
wherein at least one of the injection molded body and the interference field protective part is electroconductive and earthed, and
wherein the interference field protective part is at least one of:
completely embedded into the plastic material of the injection molded body, and
surrounded by the plastic material on one of an inner side of the interference field protective part and an outer side of the interference field protective part.

18. The control system according to claim 17, wherein the interference field protective part comprises at least one of a ferromagnetic material, a paramagnetic material, and a diamagnetic material.

19. The control system according to claim 17, wherein the interference field protective zone comprises a plurality of material pieces embedded therein; and
wherein the plurality of material pieces comprise at least one of a ferromagnetic material, a paramagnetic material, and a diamagnetic material.

20. The control system according to claim 17, wherein the interference field protective part comprises at least one of a ferromagnetic material, a paramagnetic material, and a diamagnetic material; and
wherein the interference field protective zone comprises a plurality of material pieces embedded therein, the plurality of material pieces comprising at least one of a ferromagnetic material, a paramagnetic material, and a diamagnetic material.

* * * * *